United States Patent
Ng et al.

(10) Patent No.: US 7,075,233 B2
(45) Date of Patent: Jul. 11, 2006

(54) DIE ATTACH FOR LIGHT EMITTING DIODE

(76) Inventors: Kee Yean Ng, 6 Halaman Kikik, Taman Inderawasih, 13600 Prai, Penang (MY); Teong Heng Sim, 3 Jalan Indah, Taman Bukit Indah, 14000 Bukit Mertajam, Penang (MY); Chong Hai Lee, 118A-01-08, Pearl Garden, Jalan Dato Ismail Hashim, 1900, Bayan Baru, Penang (MY)

(*) Notice: Subject to any disclaimer, the term of this patent is extended or adjusted under 35 U.S.C. 154(b) by 320 days.

(21) Appl. No.: 10/617,626

(22) Filed: Jul. 10, 2003

(65) Prior Publication Data

US 2005/0006755 A1    Jan. 13, 2005

(51) Int. Cl.
*H05B 33/00* (2006.01)
(52) U.S. Cl. .......................................... 313/512; 445/23
(58) Field of Classification Search .................. 313/512
See application file for complete search history.

(56) References Cited

U.S. PATENT DOCUMENTS 3,487,541 A * 1/1970 Boswell ........................ 29/832

* cited by examiner

*Primary Examiner*—Joseph Williams

(57) ABSTRACT

Improved LED die mount. By mounting an LED die on a pedestal which is smaller than the LED die, formation of fillets of die mount material which would block some of the light from the LED die are reduced or eliminated.

10 Claims, 3 Drawing Sheets

DIE ATTACH FOR LIGHT EMITTING DIODE

BACKGROUND OF THE INVENTION

1. Field of the Invention

The present invention relates to the field of Light Emitting Diodes (LEDs). More particularly, it pertains to a method of attaching the LED die to improve light output.

2. Art Background

In use, Light Emitting Diode (LED) dies are packaged by mounting them to a substrate such as a printed circuit board (PCB) or a leadframe. The LED die is mounted to the substrate using a material such as an adhesive, often epoxy-based conductive adhesives, solder, solder paste, or eutectic alloys. When the die is mounted, the mounting material naturally forms a fillet up the side walls of the LED die. Being opaque, the fillet blocks a portion of the light generated by the LED.

SUMMARY OF THE INVENTION

By mounting the LED die on a pedestal smaller than the die, fillets formed by die attach material along the sides of the die are reduced or eliminated.

BRIEF DESCRIPTION OF THE DRAWINGS

The present invention is described with respect to particular exemplary embodiments thereof and reference is made to the drawings in which.

DETAILED DESCRIPTION

Figure 1:
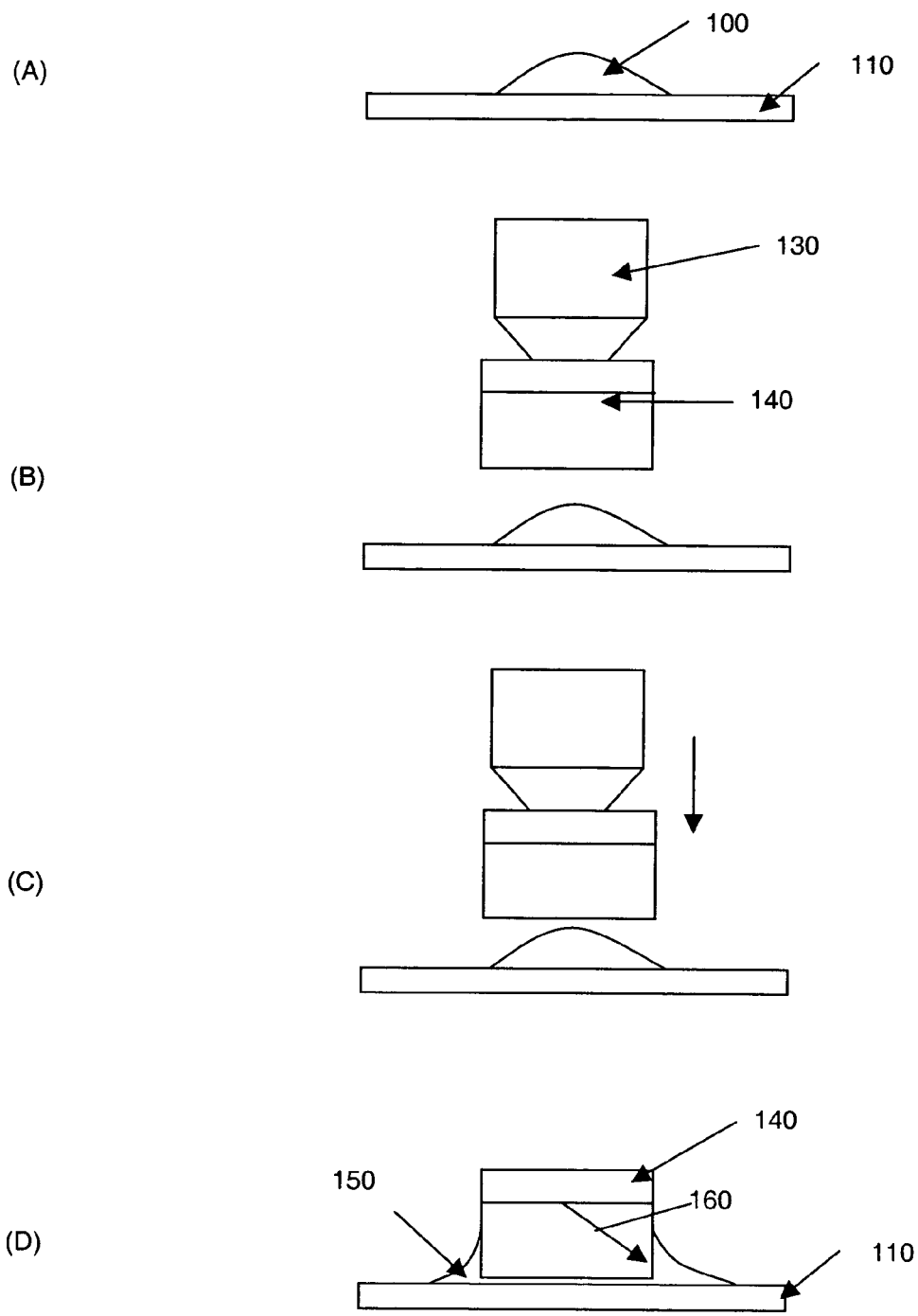
FIG. 1 shows an LED die mount.

FIG. 1 shows a LED die mounted according to the prior art. Detail A shows die mount material 100 on substrate 110. While the substrate shown in FIG. 1 is flat, it may be curved, such as a curved mount used for single LEDs. The die mount material may be an adhesive such as a conductive epoxy, or may be solder, solder paste, or a eutectic alloy as known to the art.

Detail B shows collet 130 supporting LED die 140. Collet 130 may be operated automatically or by hand. Detail C shows the collet and die moving to contact the substrate and die mount material.

Detail D shows LED die 140 affixed to substrate 110, with fillets 150 of the die mount material flowing along the sides of LED 140. The opaque nature of fillets 150 blocks light ray 160. This is a particular problem if the active PN junction of die 140 is near substrate 110 and subject to being blocked by fillets 150.

Figure 2:
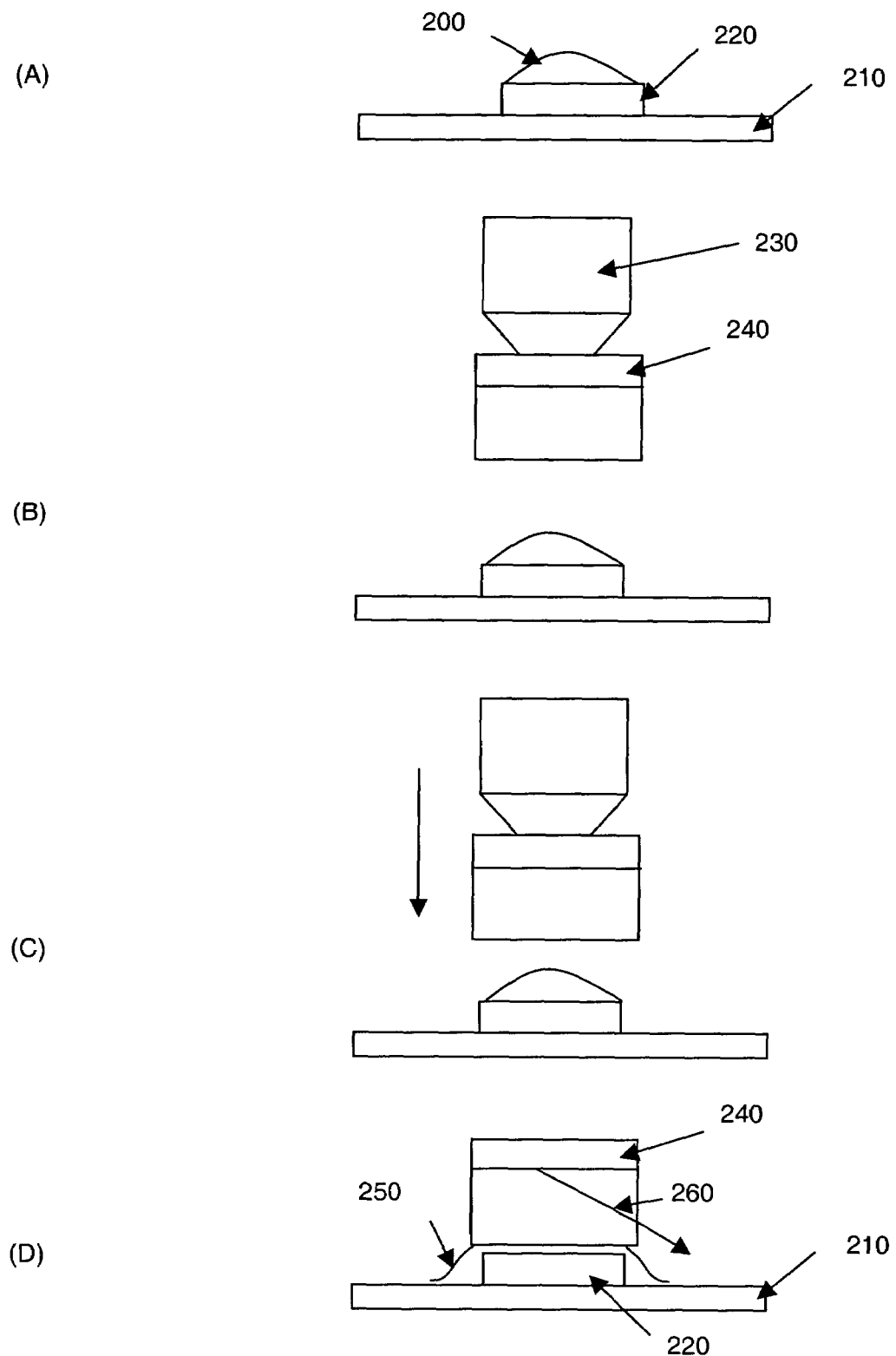
FIG. 2 shows an LED die mount according to the present invention.

According to one embodiment of the present invention as shown in FIG. 2, Detail A shows die mount material 200 placed on pedestal 220 on substrate 210. Pedestal 220 is smaller in size than the LED die to be attached. Pedestal 220 may be formed through the stamping process in the case where substrate 210 is a leadframe. Pedestal 220 may be formed through a plating process in the case where substrate 210 is a printed circuit board (PCB). Pedestal 220 may also be a separate component attached to substrate 210. The height of pedestal 220 is determined mainly by the characteristics of die mount material 200. The shape of pedestal 220 does not have to match that of die 240. For example, both die 240 and pedestal 220 may be rectangular in shape. In other instances, die 240 may be square or rectangular, and pedestal 220 may be circular or oval.

Detail B shows collet 230 supporting LED die 240. Detail C shows the collet and die moving to contact the die mount material on the pedestal and substrate.

Detail D shows LED die 240 affixed to pedestal 220 and substrate 210. Since pedestal 220 is smaller than die 240, fillets 250 of mount material do not encroach on the sides of LED die 240. Thus, light ray 260 is not blocked.

It is also possible to first affix the pedestal to the die, and then affix the combined pedestal and pedestal to the substrate.

Figure 3:
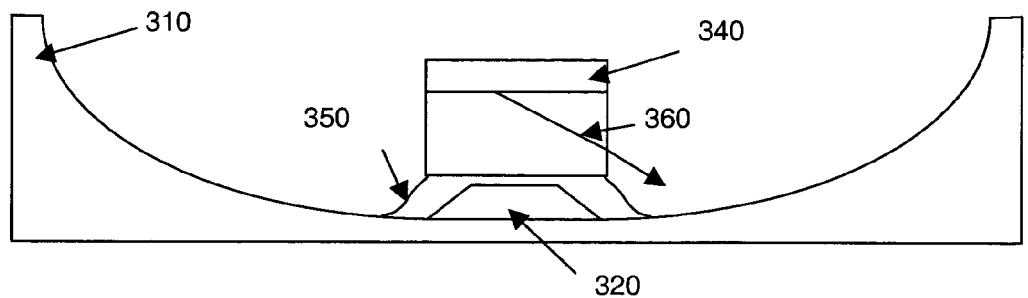
FIG. 3 shows an additional LED die mount according to the present invention.

FIG. 3 shows an embodiment of the present invention in which the substrate is curved, as in a leadframe. In this embodiment, leadframe 310 is formed with raised pedestal 320 to which LED die 340 is attached. As pedestal 320 is smaller than LED die 340, fillets 350 of die attach material do not obscure the sides of LED die 340, this allowing light ray 360 to pass. Also shown in FIG. 3, the sides of pedestal 320 do not have to be normal to the substrate, or parallel to each other.

Figure 4:
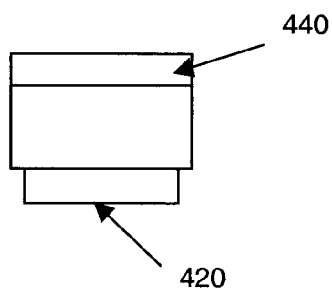
FIG. 4 shows an additional embodiment of the present invention.

FIG. 4 shows an additional embodiment of the invention in which pedestal 420 is formed as part of die 440. The pedestal feature may be formed by mechanical means such as sawing, or by chemical means such as dry or wet etching.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. An improved light emitting diode mount comprising:
   a light emitting diode die,
   a substrate,
   a pedestal on the substrate and having a first surface with an area smaller than an area of a first surface of the die, and
   adhesive material affixing the first surface of the die to the first surface of the pedestal, the adhesive material covering and extending beyond the first surface of the pedestal.

2. The device of claim 1 where the pedestal is formed as part of the substrate.

3. The device of claim 1 where the pedestal is a separate component from the substrate and the die.

4. The method of mounting a light emitting diode die to a substrate comprising:
   forming a pedestal smaller than the die on one surface of the die, and
   affixing a contact surface of the pedestal to the substrate with adhesive that extends beyond the contact surface of the pedestal.

5. The method of claim 4 wherein forming a pedestal on a surface of a die comprises attaching the pedestal to the die.

6. The method of claim 4 wherein forming a pedestal on a surface of a die comprises forming the pedestal integrally with the die.

7. The method of mounting a light emitting diode die to a substrate comprising:

forming a pedestal smaller than the die on the substrate, and affixing a contact surface of the die to a contact surface of the pedestal with adhesive that extends beyond the contact surface of the pedestal.

8. The method of claim 7 wherein forming a pedestal on the substrate comprises attaching the pedestal to the substrate.

9. The method of claim 7 wherein forming a pedestal on the substrate comprises forming the pedestal integrally with the substrate.

10. An improved light emitting diode mount comprising:

a light emitting diode die, a pedestal carried by the die, the pedestal having a smaller profile than the die, a substrate, and adhesive material affixing a contact surface of the pedestal to the substrate, the adhesive material covering and extending beyond the contact surface of the pedestal.

\* \* \* \* \*